(12) United States Patent
Kurita

(10) Patent No.: US 6,740,811 B2
(45) Date of Patent: May 25, 2004

(54) ELECTRIC TERMINAL FOR AN ELECTRONIC DEVICE

(75) Inventor: Yoichiro Kurita, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/002,198

(22) Filed: Dec. 5, 2001

(65) Prior Publication Data

US 2002/0066584 A1 Jun. 6, 2002

(30) Foreign Application Priority Data

Dec. 6, 2000 (JP) .................................... 2000-370980

(51) Int. Cl.[7] .................................................. H05K 5/00
(52) U.S. Cl. .................... 174/52.1; 174/256; 174/260; 174/261
(58) Field of Search ............................. 194/52.1, 256, 194/260, 261, 255, 258; 257/737, 690, 738, 765

(56) References Cited

U.S. PATENT DOCUMENTS 6,329,605 B1 * 12/2001 Beroz et al. ................. 174/256
6,358,068 B1 *  3/2002 Houtz ........................... 439/83

* cited by examiner

Primary Examiner—Dean A. Reichard
Assistant Examiner—Jinhee Lee
(74) Attorney, Agent, or Firm—McGinn & Gibb, PLLC

(57) ABSTRACT

An electric terminal of an electronic device includes an external electrode, a flexible lead member for connecting the external electrode to a pad of the electronic device, and a support member for surrounding the lead member and mechanically supporting the external electrode when the lead member is deformed by a heat stress applied to the external electrode. By separating the electric connection function from the supporting function in the electric terminal, a reliable connection can be achieved after a heat cycle test of the electronic device.

29 Claims, 4 Drawing Sheets

ELECTRIC TERMINAL FOR AN ELECTRONIC DEVICE

BACKGROUND OF THE INVENTION a. Field of the Invention

The present invention relates to an electric terminal for an electronic device and, more particularly, to the structure of an electric terminal for use in an electronic device and having a higher connection reliability. The present invention also relates to a method for forming such an electric terminal.

b. Description of the Related Art

The reliability of an electronic device often depends on the connection reliability of the electric terminals used in the electronic devices. FIGS. 1A to 1D show conventional electric terminals used in semiconductor devices, which are to be mounted on respective printed circuit boards (mounting board) by using a flip-chip bonding technique. FIGS. 2A to 2D corresponding to FIGS. 1A to 1D, respectively, show the electric terminals after the heat cycle tests thereof.

FIG. 1A shows the basic structure of the flip-chip bonding terminal called C4 type, wherein an external electrode implemented by a solder ball 32 formed on an electronic device 31 is mounted on a pad 34 of a printed circuit board 33, and is melted thereon for bonding.

In general, after the melting and subsequent cooling steps of the mounting process, an under-filling process is conducted wherein the space between the electronic device 31 and the printed circuit board 33 is filled with resin, which is then subjected to a curing step. The under-filling process improves the reliability of the bonding structure during the subsequent heat cycle test by diversifying the thermal stress applied onto the bonding structure during the heat cycle test. The heat cycle test is likely to cause a crack 38 in the solder ball 32, such as shown in FIG. 1B.

The is a problem in the basic structure of the flip-chip bonding structure of FIG. 1A that the under-filling step increases the fabrication steps and thus raises the cost of the electronic device. In addition, the smaller pitch of the arrangement for the external terminals of the up-to-date electronic device due to the higher integration of the semiconductor devices renders the under-filling step itself difficult.

FIGS. 1B to 1D are improved conventional flip-chip bonding structures devised or proposed in view of the above problems in the basic structure shown in FIG. 1A.

In FIG. 1B, an interposer substrate or sheet 35 is interposed between the electronic device 31 and the solder ball 32 for alleviating or absorbing the stress. The electric connection between the electronic device 31 and the solder ball 32 is implemented by an interconnecting wire or an inner lead of a tape automated bonding (TAB) structure.

It is difficult to use the interposer substrate 35, however, for an electronic device having higher-density terminals because of the difficulty in arranging a large number of interconnecting wires with a higher density. In addition, the thermal expansion of material used for the interposer sheet may damage the bonding structure to cause a crack 38 in the solder ball, as shown in FIG. 2B.

In FIG. 1C, a conductive post or pole 36 such as made of Cu is formed on the electronic device 31, and the solder ball 32 is disposed on the top of the conductive post 36. The conductive post 36 should have a diameter sufficient for supporting the solder ball 32 and a height sufficient for absorbing the stress.

It is difficult, however, to design the diameter and the height of the conductive post 36 because a trade-off resides between the handling or testing of the electronic device and the reliability for the bonding structure of the electronic device. More specifically, the handling or testing step requires a larger diameter and a smaller height of the conductive post 36 to have a sufficient mechanical strength, whereas a higher reliability in the bonding structure requires a smaller diameter and a large height of the conductive post 36 for absorbing the thermal stress to avoid a crack 38 in the solder ball 32 (FIG. 2C).

In FIG. 1D, a conductive spring or wire 37 is used instead of the solder ball 32 for achieving a higher density of the external terminals. The surface of the wire 37 is coated with a thick plating film for achieving a sufficient mechanical strength and resilience.

The wires 37, however, have a lower allowance for a misalignment in arrangement of the terminals and for the uniformity in the height of the terminals, i.e., for the coplanarity in arrangement of the terminals, compared to the solder balls which allow a relatively large deviation in the arrangement and the height. This lowers the product yield of the electronic devices having such wires 37 irrespective of employing a BGA structure for the electric terminals.

SUMMARY OF THE INVENTION

In view of the above problems in the conventional techniques, it is an object of the present invention to provide an electric terminal for use in an electronic device.

It is another object of the present invention to provide a method for forming such an electric terminal on an electronic device.

The present invention provides an electric terminal for an electronic device including: an external electrode; a lead member disposed on an internal electrode of the electronic device, at least a portion of the lead member being a conductor connecting the external electrode and the internal electrode; and a support member disposed on the electronic device in the vicinity of the lead member for supporting the external electrode at least upon application of an external thrust force which deforms the lead member.

The present invention also provides a method for forming an electric terminal on an electronic device including the steps of: forming a lead member on an internal electrode of the electronic device; forming an external electrode on the lead member; and forming a support member on the electronic device in a vicinity of the lead member, the support member being in contact with the external electrode at least upon application of an external force which deforms the lead member.

In accordance with the electric terminal of the present invention and the electric terminal manufactured by the method of the present invention, by separating the lead member having an electric connection function of the electric terminal from the support member having a mechanical supporting function of the electric terminal, a reliable electric connection can be obtained after a heat cycle test for the electronic device.

The above and other objects, features and advantages of the present invention will be more apparent from the following description, referring to the accompanying drawings.

PREFERRED EMBODIMENTS OF THE INVENTION

Now, the present invention is more specifically described with reference to accompanying drawings.

Figure 1A:
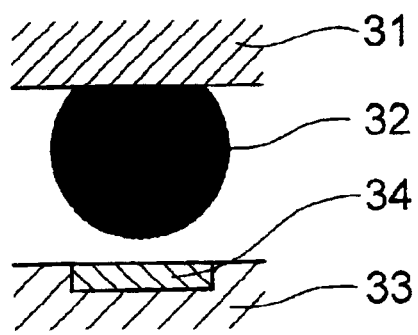
FIGS. 1A to 1D are sectional views of conventional electric terminals.
Figure 1B:
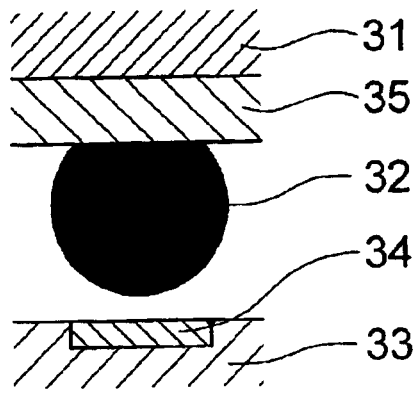
Figure 1C:
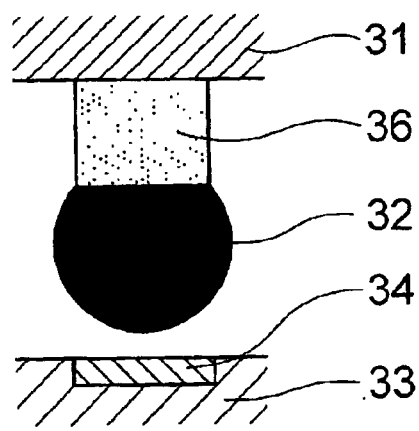
Figure 1D:
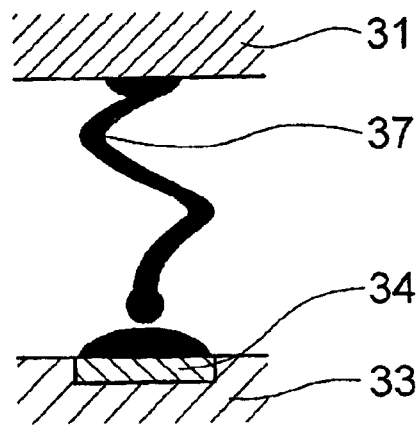
Figure 2A:
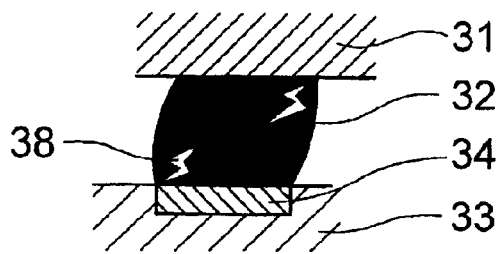
FIGS. 2A to 2D show after heat cycle tests for the conventional electric terminals of FIGS. 1A to 1D, respectively.
Figure 2B:
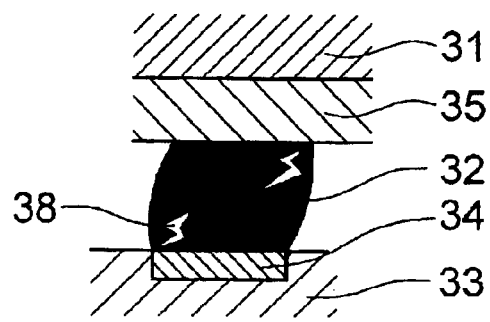
Figure 2C:
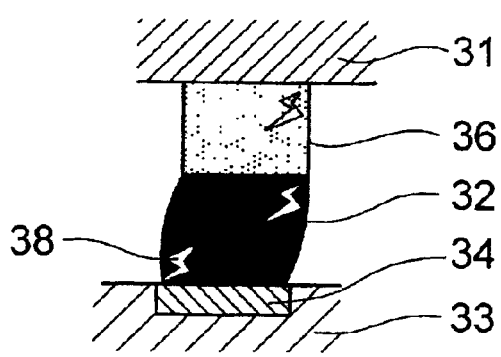
Figure 2D:
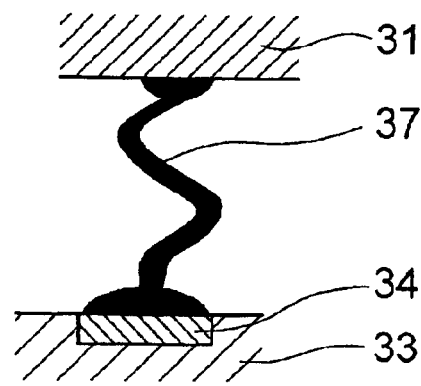
Figure 3A:
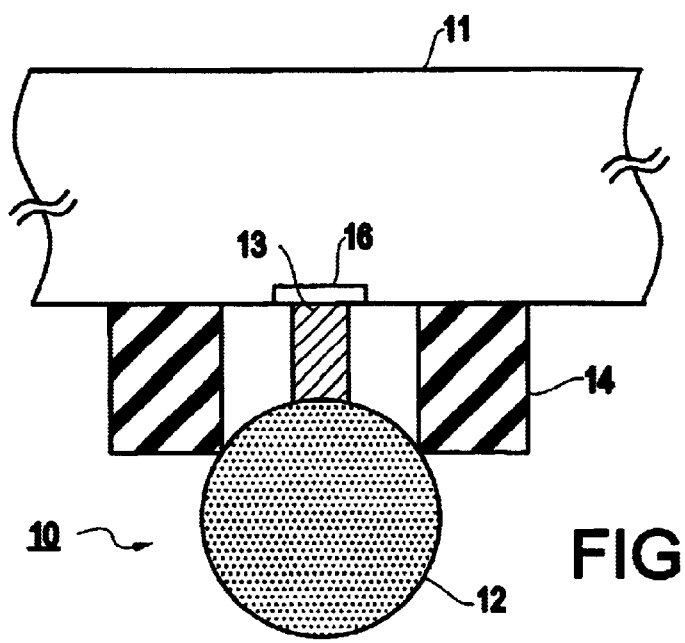
FIGS. 3A–3C are sectional views of an electric terminal according to an embodiment of the present invention.
Figure 3B:
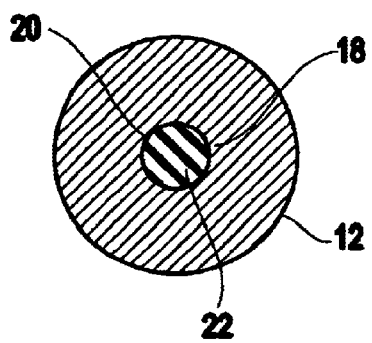
Figure 3C:
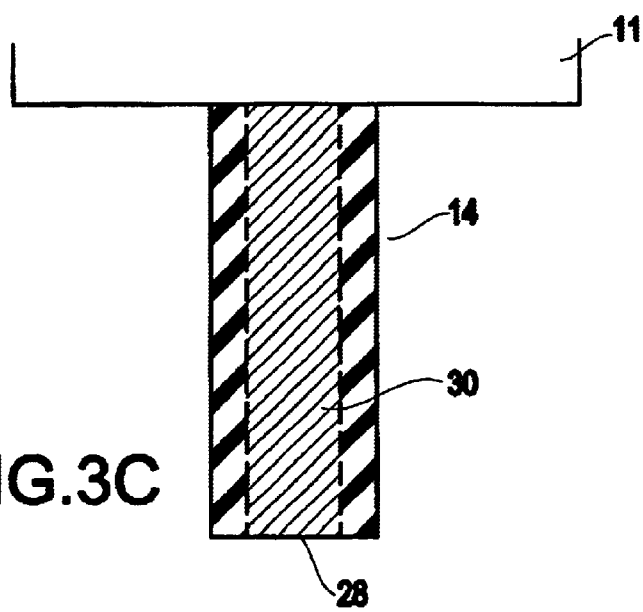

Referring to FIG. 3, an electric terminal, generally designated by numeral 10, according to an embodiment of the present invention is formed on an electronic device 11 such as an LSI. The electric terminal 10 includes a solder ball or external electrode 12, an elongate lead member 13 for electrically connecting the solder ball 12 to a pad 16 of the electronic device 11, and a support member 14 for mechanically supporting the solder ball 12 on the surface of the electronic device 11.

The lead member 13 has a resilience and thus absorbs the thermal stress occurring during a heat cycle test due to a difference in the thermal expansion coefficient between the electronic device 11 and a printed circuit board (not shown) on which the solder ball 12 is to be mounted. The lead member 13 is preferably made of a conductive material such as a metallic wire, or may be made of an insulator body, such as a resist bump, coated with a conductive film.

The support member 14 surrounds the lead member 13, and has a function for preventing an excessive deformation of the lead member 13 during an electrical test step of the electronic device 11, wherein the solder ball 12 is applied with a thrust force by a probe pin, by maintaining the location of the solder ball 12 within a specified range.

The support member 14 also has some extent of resilience and thus prevents the solder ball 12 from being applied with an excessive, local stress concentration. The support member 14 is preferably made of an insulator film patterned by a photolithographic patterning technique.

In the structure of the first embodiment, since the mechanical structure for supporting the external electrode 12 with respect to the electronic device 11 is physically separated from the electric element for electrically connecting the external electrode 12 to the electronic device 11, both the reliability of the electric connection against a damage by the thermal stress and the mechanical strength necessary for handling and testing the electronic device can be achieved.

The term "electronic device" as used herein includes a single LSI chip such as called flip-chip, and a variety of types of semiconductor packages including a chip scale package generally fabricated by a wafer-level packaging technique. The chip scale package is such that an interconnect layer formed on an array of chip electrodes is provided thereon with another array of external electrodes.

The lead member 13 may be made of any material or materials and may have any dimensions, so long as the lead member 13 effectively connects the electronic device 11 to the printed circuit board via the solder ball 12 and has a flexibility for deformation upon application of a stress thereto.

For example, the lead member 13 may be a conductor post disposed on the electronic device 11, or may be a conductor post formed by selectively plating the surface of the electronic device 11. In addition, the lead member 13 may be a conductor post formed separately from the electronic device 11 and then disposed on the electronic device 11, a conductor post formed by etching a metallic film, a conductor post formed by a wire bonding technique, or a metallic wire coated with an insulator film. Further, the lead member 13 may be a conductor bump, at least a portion of which is made of solder, or an insulator post having a central hole filled 28 with a conductor 30 by using, for example, a plating technique.

In the present embodiment, a solder ball is used as the external electrode 12. However, the external electrode 12 may have any structure or any dimensions, so long as the external electrode 12 is bonded to the pad of the printed circuit board by using a thermally melting technique. For example, the external electrode 12 may have a Cu core 18 having a solder coat 20 at least on a portion of the surface thereof. In some cases, solder may be provided onto the printed circuit board or mounting board without providing solder to the external electrode.

The external electrode 12 may have a core ball made of a conductor material or conductor materials and coated with a solder, the core ball having a higher melting point compared to the solder coat. The core ball may be made of a conductor shell receiving therein an insulator sub-core 22.

The supporting member 14 may preferably be made of an insulator. The supporting member 14 need not entirely surround the lead member 12: for example, the supporting member 14 may be a combination of four insulator poles disposed radially outside the central lead member 13. The supporting member 14 need not contact the surface of the solder ball 12 when no external force is applied between the solder ball 12 and the supporting member 14. At least a par of the supporting member 14 may be made of a conductor or metal which may be formed on the chip electrode, whereby the supporting member has 14 a higher mechanical strength and effectively supports the solder ball 12.

The supporting member 14 may be an insulator film patterned by a photolithographic technique, or a resin body which is configured by a transfer molding technique and may be patterned to have a specified shape by using a laser etching, wet etching or dry etching technique.

The supporting member 14 may include an insulator film or plate having a central through-hole 28 filled with a conductor plug 30 after the insulator film is attached onto the electronic device. In an alternative, the insulator film or plate of the supporting member 14 may be attached onto the electronic device forming therein the through-hole 28.

Figure 4:
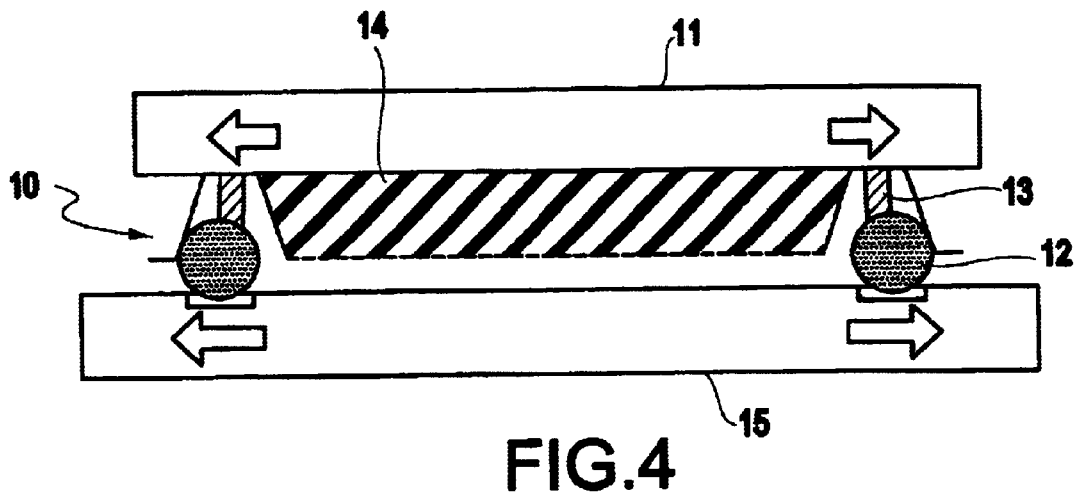
FIG. 4 is a sectional view of the electric terminal of FIG. 1 after mounting the electronic device on a printed circuit board.

Referring to FIG. 4, it is shown that a semiconductor circuit (electronic device) 11 having a plurality of external terminals according to the above embodiment is mounted on a printed circuit board 15. The arrows illustrated in FIG. 4 indicate the stresses when the semiconductor device 11 and the printed circuit board 15 are subjected to a higher temperature. As shown therein, the printed circuit board 15 has a higher thermal expansion coefficient compared to the semiconductor device 11. Thus, the external terminals 10 disposed at the outermost sides of the semiconductor device 11 are subjected to highest thermal stresses.

Each of the solder balls 12 disposed at the outermost sides shown in the figure is subjected to a highest thermal stress applied in the outer direction, and thus shifted slightly toward the outer side with respect to the semiconductor device 11 including the support member 14, without involving a disconnection between the solder ball 12 and the lead member 13 or without a crack in the lead member 13.

Figure 5A:
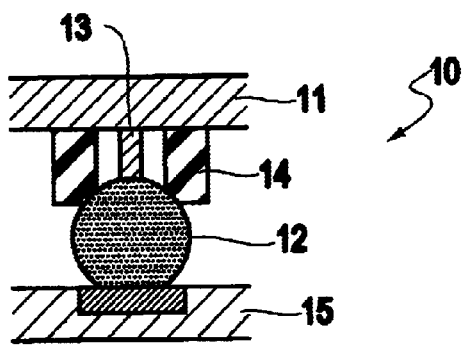
FIGS. 5A and 5B are sectional views showing the electric terminal of FIG. 3A during a heat cycle test thereof.
Figure 5B:
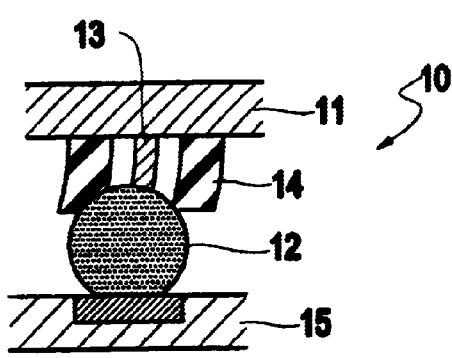
Figure 6:
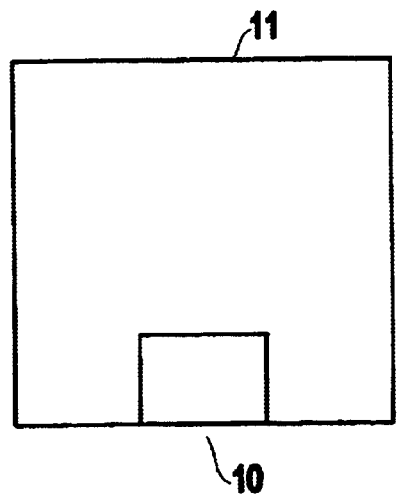
FIG. 6 is a sectional view showing an electric terminal of the present invention as part of an electronic instrument.

FIGS. 5A and 5B show the situations of the external terminal 10 of the present embodiment during the heat cycle test, wherein FIG. 5A shows the situation during a lower temperature whereas FIG. 5B shows the situation during a higher temperature. The solder ball 12 is moved in the horizontal direction during the heat cycle due to the flexibility of the lead member 13 and the support member 14 without a damage in the electric connection.

In the configuration of the electric terminal of the present embodiment, the under-filling step is unnecessary for the bonding structure because the electric terminal is not damaged by the heat cycle test due to the function of the lead member and the support member.

Since the above embodiments are described only for examples, the present invention is not limited to the above embodiments and various modifications or alterations can be easily made therefrom by those skilled in the art without departing from the scope of the present invention.

What is claimed is:

1. A semiconductor device for use on a printed circuit board, comprising:
    a semiconductor chip having a thermal expansion coefficient different from a thermal expansion coefficient of the printed circuit board;
    a lead member connected to the semiconductor chip;
    an external electrode for electrically connecting said lead member with said printed circuit board; and
    a support member disposed on the semiconductor chip to surround said lead member,
    wherein said support member contacts said external electrode at least upon application of an external thrust force which deforms said lead member.

2. The semiconductor device as defined in claim 1, wherein said support member is in contact with said external electrode upon application of no external thrust force.

3. The semiconductor device as defined in claim 1, wherein said support member is out of contact with said external electrode upon application of no external thrust force.

4. The semiconductor device as defined in claim 1, wherein said external electrode comprises a solder ball.

5. The semiconductor device as defined in claim 1, wherein said external electrode includes a core, at least a portion of which is covered by a solder coat.

6. The semiconductor device as defined in claim 1, wherein said external electrode includes a central core comprising at least one conductor material and covered by a solder coat, said conductor material having a melting point higher than a melting point of said solder coat.

7. The semiconductor device as defined in claim 1, wherein said external electrode includes a central core made of at least one conductor material and covered by a solder coat, said central core receiving therein an insulator sub-core.

8. The semiconductor device as defined in claim 1, wherein said lead member comprises a conductor.

9. The semiconductor device as defined in claim 1, wherein said lead member includes a conductor body formed by plating.

10. The semiconductor device as defined in claim 1, wherein said lead member includes a conductor body formed separately from and connected to the electronic device.

11. The semiconductor device as defined in claim 1, wherein said lead member is formed by etching a metallic film.

12. The semiconductor device as defined in claim 1, wherein said lead member includes a wire.

13. The semiconductor device as defined in claim 1, wherein said lead member includes a wire covered by an insulator coat.

14. The semiconductor device as defined in claim 1, wherein said lead member comprises a conductive material including solder.

15. The semiconductor device as defined in claim 1, wherein said lead member includes an insulator body having a through-hole filled with a plating conductor.

16. The semiconductor device as defined in claim 1, wherein said support member includes an insulator body patterned by a photolithographic technique.

17. The semiconductor device as defined in claim 1, wherein said support member comprises a resin material configured by a transfer molding technique.

18. The semiconductor device as defined in claim 17, wherein said support member is made by etching said resin material.

19. The semiconductor device as defined in claim 18, wherein said etching includes at least one of laser etching, wet etching and dry etching.

20. The semiconductor device as defined in claim 1, wherein said support member includes an insulator body having a through-hole through which said lead member passes.

21. The semiconductor device as defined in claim 1, wherein said support member is formed by patterning an insulator plate by an etching.

22. The semiconductor device as defined in claim 21, wherein said etching is either laser etching, wet etching or dry etching.

23. An electronic instrument comprising the semiconductor device as defined in claim 1.

24. The semiconductor device according to claim 1, wherein said support member partially surrounds said lead member to prevent excessive deformation of said lead member.

25. The semiconductor device according to claim 1, wherein said lead member for electrically connecting said external electrode is separately disposed from said support member when no external force is applied.

26. The semiconductor device according to claim 1, wherein said lead member is substantially parallel to said support member to isolate electrically said lead member from said external electrode.

27. The semiconductor device according to claim 1, wherein said support member comprises a plurality of insulator poles disposed radially outside said lead member.

28. The semiconductor device according to claim 1, wherein said support member is separately disposed from said external electrode.

29. The semiconductor device according to claim 1, wherein said support member is made by etching and partially surrounds said lead member.

* * * * *